United States Patent [19]

Beaman et al.

[11] Patent Number: 4,975,079
[45] Date of Patent: Dec. 4, 1990

[54] CONNECTOR ASSEMBLY FOR CHIP TESTING

[75] Inventors: Brian S. Beaman, Hyde Park; Keith E. Fogel, Bardonia; Jungihl Kim, Chappaqua; Wolfgang Mayr, Poughkeepsie, all of N.Y.; Jane M. Shaw, Ridgefield, Conn.; George F. Walker, New York, N.Y.

[73] Assignee: International Business Machines Corp., Armonk, N.Y.

[21] Appl. No.: 485,016

[22] Filed: Feb. 23, 1990

[51] Int. Cl.$^5$ ............................................. H01R 11/18
[52] U.S. Cl. .................... 439/482; 324/158 P
[58] Field of Search ............. 439/55, 65, 68, 69, 439/70, 71, 66, 482; 324/158 P, 158 F

[56] References Cited

U.S. PATENT DOCUMENTS 3,680,037  7/1972  Nellis et al. .......................... 439/591
3,862,790  1/1975  Davies et al. ......................... 439/66
4,373,778  2/1983  Adham ................................ 439/487

FOREIGN PATENT DOCUMENTS

3151933A1  12/1981  Fed. Rep. of Germany.

OTHER PUBLICATIONS

IBM Technical Bulletin, vol. 21, No. 11, "Pad Deformation Contactor", 4-1979, pp. 4511-4512.

Primary Examiner—Neil Abrams
Assistant Examiner—Khiem Nguyen
Attorney, Agent, or Firm—Perman & Green

[57] ABSTRACT

An electrical connector is described for making contact with a plurality of convex and deformable contacts on an electronic device. The electrical connector comprises a substrate having a plurality of conductors which extend above its surface. A polymeric material is disposed on the surface of the substrate and has openings which expose the conductors, each opening sized to receive one of the convex, deformable contacts, and to enable electrical connection between the exposed conductors and the deformable contacts. A mechanism is provided for urging the deformable contacts on the electronic device against the exposed conductors. The mechanism exerts sufficient force between the device and the conductors to cause some deformation of the convex contact areas by the conductors.

10 Claims, 3 Drawing Sheets

CONNECTOR ASSEMBLY FOR CHIP TESTING

FIELD OF THE INVENTION

This invention relates to electrical connectors and, more particularly, to an electrical connector adapted to temporarily contacting conductive pads on a semiconductor chip during burn-in or other test procedures.

BACKGROUND OF THE INVENTION

Many semiconductor chips are manufactured with solder bumps, balls or lands to enable interconnection to the "outside world". During the production of such chips, it is necessary to contact the solder interconnect areas to allow the chips to be electrically tested. Such tests are often performed during "burn-in" when the chip is subjected to an elevated ambient temperature while being simultaneously electronically operated.

However, it is often the case that the solder interconnect areas do not extend a uniform height from the surface of the chip. Thus, prior art interconnect systems have used connectors which exhibit some flexibility so that the height differences of the solder interconnect areas can be accommodated.

One such connector employs spring loaded pins which automatically adjust to the various solder heights when pressure is applied between the connector and the chip. Spring-loaded connectors are both expensive and present problems when operated in a high temperature ambient. Another type of connector is known as a "probe-card" and includes a plurality of cantilevered, flexible beams which independently make contact with the various solder interconnect areas as the probe-card is brought down upon the chip. Because of the size of the probe-card, the number of chips which can be contacted is limited and registration between multiple chips and the probe card is difficult to achieve.

The prior art also illustrates other types of flexible interconnectors. For instance, in German patent No. GE3151933-A1, a plurality of parallel rows of contacts are embedded in an elastic dielectric matrix. Each contact is designed as a springy wire, thereby enabling the connector to be placed between devices to be electrically interconnected. Then, by pressing the assembly together, the elastic dielectric matrix and springy contacts are compressed and make electrical interconnections. In U.S. Pat. No. 3,680,037 to Nellis et al., a similar interconnection scheme is taught wherein compressible conductive rods are employed to provide electrical contact between a pair of conductive matrices. Here again, the compression of the interconnecting rod assembly between the conductive matrices enables connections to be accomplished. In U.S. Pat. No. 3,862,790 to Davies et al., another interconnection scheme is shown wherein a plurality of parallel conductors are held in a block of insulating material. When circuit boards to be interconnected, via the parallel conductors, they are placed on either side of the interconnection matrix and pressed together-and, the insulating material yields slightly to enable the conductors to make the desired connections.

In view of the very high density of solder interconnect areas on modern chips, the use of flexible connectors may result in inadvertent shorts. Furthermore, flexible interconnect systems, during use, become distorted so that registration with solder interconnection areas is not assured.

Accordingly, it is an object of this invention to provide an electrical interconnector wherein rigid and easily registered contacts are employed.

It is another object of this invention to provide an electrical interconnector for chips which employ solder connection areas wherein height differences in the interconnection areas are accommodated by the contact system.

It is yet another object of this invention to provide an interconnect system for a chip having solder land areas wherein the system is self-aligning.

SUMMARY OF THE INVENTION

An electrical connector is described for making contact with a plurality of convex and deformable contacts on an electronic device. The electrical connector comprises a substrate having a plurality of conductors which extend above its surface. A polymeric material is disposed on the surface of the substrate and has openings which expose the conductors, each opening sized to receive one of the convex, deformable contacts, and to enable electrical connection between the exposed conductors and the deformable contacts. A mechanism is provided for urging the deformable contacts on the electronic device against the exposed conductors. The mechanism exerts sufficient force between the device and the conductors to cause some deformation of the convex contact areas by the conductors.

DETAILED DESCRIPTION OF THE INVENTION

Figure 1:
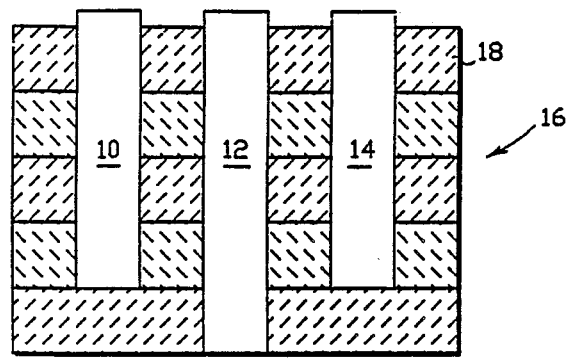
FIG. 1 is a section of a multilayer interconnect module prior to contact processing.

Referring to FIG. 1, a plurality of rigid conductors 10, 12, and 14 are mounted in a multilayer modular structure 16. Each layer of module 16 includes conductive circuit pathways which provide connections between the conductors and input-output pins (not shown). Preferably, conductors 10, 12, and 14 are comprised of molybdenum and the layers of module 16 are comprised of a suitable ceramic material (e.g. aluminum oxide).

Figure 2:
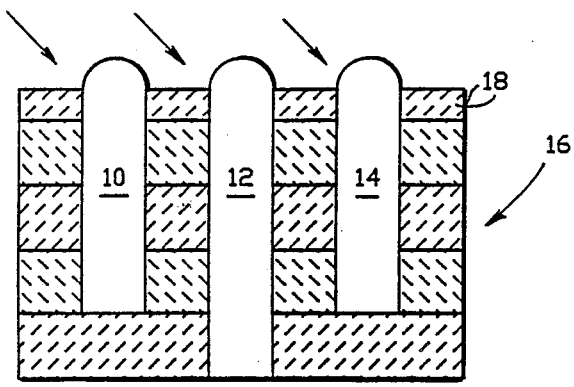
FIG. 2 is a section of the interconnect module after its uppermost surface has been ablated by an abrasive spray.

Next, a portion of layer 18 is removed to further expose and shape the tips of the rigid conductors 10, 12, and 14. As shown in FIG. 2, a grit-blasting technique is employed to abrade and remove a portion of layer 18 as well as to round off the tips of conductors 10, 12, and 14. A silicon carbide grit is preferably used to provide the abrasive erosion action.

Figure 3:
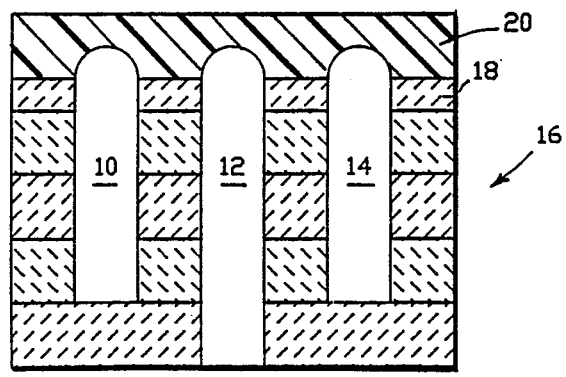
FIG. 3 is a section of the interconnect module subsequent to the deposition of a polymeric layer onto the ablated surface.

Subsequently, as shown in FIG. 3, a layer of a polymeric material 20 (e.g. a polyimide) is applied and covers the upper surface of module 16. The polyimide may be applied by any appropriate method, e.g., screening, lamination, spin coating etc. It must be thermally stable up to 150° C. and be relatively rigid once it is cured. Suitable examples of appropriate polymers are as follows: PMDA-ODA, BPDA-POA silicon containing polymers, all available commercially, (e.g. from the Dupont Corporation, Wilmington, Del.).

Figure 4:
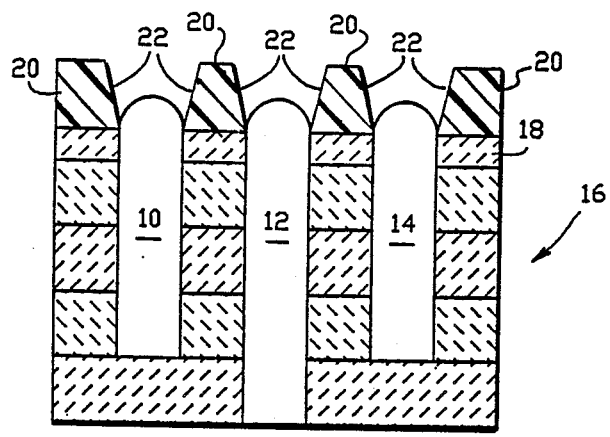
FIG. 4 is a section of the interconnect module subsequent to the removal of certain areas of the polymeric layer to expose interconnecting conductors.

Once polymeric layer 20 is cured, openings are made therein to expose the uppermost portions of electrical conductors 10, 12 and 14. This is shown in FIG. 4 and may be accomplished by employing a laser to ablate the areas of polymer 20 immediately overlaying the tip portions of conductors 10, 12, and 14. Alternatively a metal mask may be overlaid on layer 20 and exposed areas ablated with an area exposure from an excimer laser. Preferably, the sides 22 of each opening are somewhat sloped to provide a guiding action when a solder ball is inserted therein.

Figure 4A:
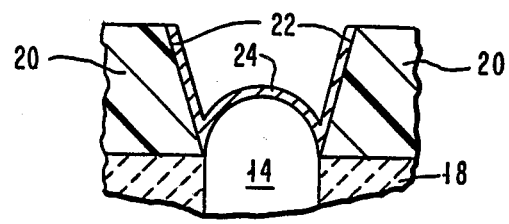
FIG. 4a is an expanded view of a portion of FIG. 4 showing a subsequently applied conductive coating.

After the tips of conductors 10, 12, and 14 have been exposed, it is preferred, but not absolutely necessary, that a thin conductive coating 24 be emplaced on the tip of each of conductors 10, 12, and 14, as well as on the sides 22 of each opening in polymer layer 20. This is shown in FIG. 4a wherein conductive layer 24 has been deposited as shown. Layer 24 is preferably a nickel-chrome material which provides both high resistance to wear and is non-wettable by solder.

During the manufacture of chip 38, the height dimension of each of solder balls 40, 42, 46, etc. is held within upper and lower limits. Thus, to assure electrical connection, the dimension between the exposed tips of conductors 10, 12, and 14 and the upper surface of polymer layer should be approximately equal to the lower limit height dimension of the solder balls. Should a solder ball not connect to a conductor, then it is known that the ball is out of limits, causing the chip to be rejected.

Figure 5:
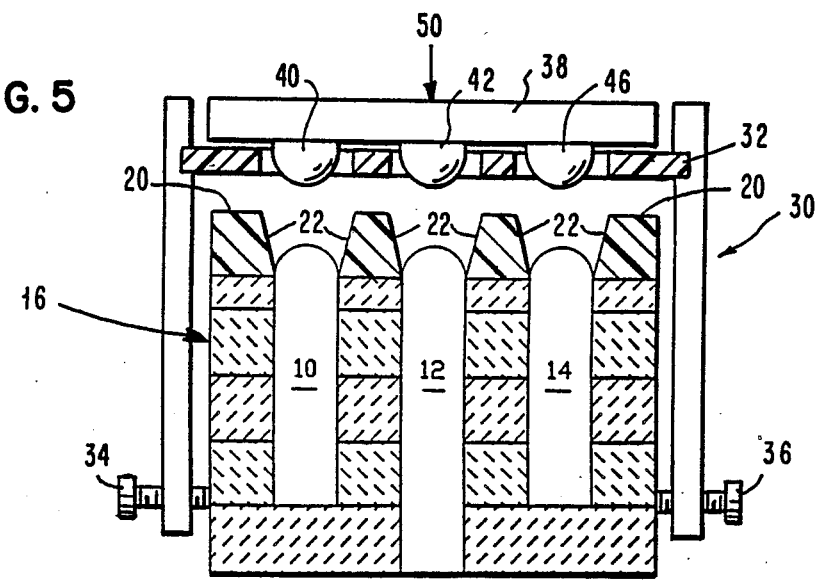
FIG. 5 is a section of the interconnect module showing a means for registering a semiconductor chip having conductive lands thereon with the electrical conductors of the module.

Interconnect module 16, as shown in FIG. 5, is mounted in an alignment fixture 30. The upper portion of alignment fixture 30 holds a polymeric sheet 32 which is provided with openings aligned with the openings previously made in polymer layer 20. The thickness of sheet 32 maybe selected to control the depth of indentation into each of the solder balls.

Figure 6:
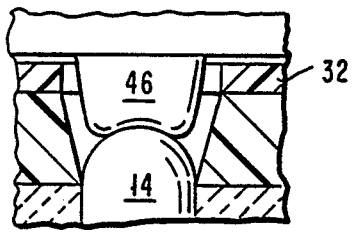
FIG. 6 is an expanded sectional view of a point of contact between an electrical conductor and a solder ball on a chip.

To assure proper registration, a pair of adjustment screws 34 and 36 enable module 26 to be moved so that the openings in layer 20 are aligned with the openings in sheet 32. Subsequently, a chip 38 having a plurality of solder balls 40, 42, and 46 is emplaced over polymeric sheet 32 so that the solder balls extend therethrough. Then, the upper surface of chip 38 is pressed downwardly until each of balls 40, 42, and 46 makes contact with the upper surfaces of conductors 10, 12, and 14. Sufficient force is applied (as schematically indicated by arrow 50) to chip 38 to cause conductors 10, 12, and 14 to indent each of solder balls 40, 42, and 46, thereby enabling good electrical contact to be established. By assuring that sufficient pressure is exerted to cause indents in the solder balls, differences in height of the solder balls (within limits) can be accommodated. Obviously, if proper contact is not made between a solder ball and a conductor tip, then the height of the solder ball is outside of allowable limits and the chip is rejected. In FIG. 6, an expanded view is shown of solder ball 46 and conductor 14 is after sufficient pressure has been exerted on chip 38 to cause conductor 14 to indent ball 46.

Figure 7:
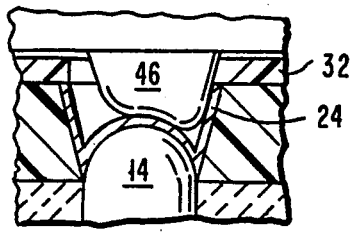
FIG. 7 is an expanded sectional view of a point of contact between an electrical conductor and a solder ball wherein the solder ball is misaligned.

It is also possible to dispense with polymeric sheet 32 and to directly emplace chip 38 onto interconnection module 16. In this case however, it may occur that there is some mis-alignment between the chip and the module so that a solder ball may not be directly aligned with its mating electrical conductor. This is shown in FIG. 7 wherein ball 46 is offset from conductor 14. In such case, good electrical contact is still assured by conductive layer 24 providing additional electrical interconnection with solder ball 46.

The above-described interconnection module provides a number of advantages. No permanent joining between the chip and the test module is necessary; it enables the simultaneous testing of many chips; it is applicable for both functional tests and burn-in tests using a single interconnect module; the chip is self-aligned and is mechanically held in place during the test operation; and the indented solder balls may be re-formed by a simple reflow operation subsequent to test, if necessary.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. An electrical connector for making contact with a pattern of convex deformable contact areas on an electronic device, each said convex deformable contact area required to exhibit at least a minimum height dimension above a contact surface of said electronic device, comprising:

a connector substrate having a plurality of rigid conductors embedded therein, and a concave opening aligned with an end of each said conductor, each said concave opening exposing said conductor end within said opening, said concave openings and conductor ends arranged to mate with said pattern of contact areas; and means for urging said electronic device and connector substrate towards each other when said electronic device is placed so that its pattern of convex contact areas is aligned with said concave openings, said urging means exerting sufficient force to cause said rigid conductors to deform said convex contact areas.

2. The electrical connector defined in claim 1 wherein said connector substrate comprises:

a module having a plurality of rigid conductors extending above at least a first surface thereof; and a polymeric layer disposed on said first surface and having an uppermost surface with concave openings exposing an end of each said rigid conductor, each concave opening sized to receive a convex deformable contact area.

3. The electrical connector defined in claim 2, wherein each said rigid conductor end is disposed a distance below said polymeric layer's uppermost surface which is approximately equal to said minimum height dimension.

4. The connector as defined in claim 1, further comprising:
a metallic coating adherent to an inner surface of each said concave opening and exposed conductor.

5. The connector as defined in claim 4, wherein said metallic coating is chosen from a class of coatings which are not reactive with said deformable contact areas.

6. The connector as defined in claim 5, wherein said convex deformable contact areas are comprised of a solder material and said metallic coating is not wet by said solder material.

7. The connector as defined in claim 1, further comprising:
mask means having a plurality of orifices oriented in registration with said concave openings in said connector substrate, for receiving said electronic device and aligning its pattern of convex contact areas with said concave openings in said connector substrate.

8. The connector as defined in claim 7, wherein, when said electronic device is positioned in said mask means so that its contact areas are aligned with and inserted in said orifices, said urging means presses said contact areas against said rigid conductors to thereby electrically contact and deform said contact areas.

9. An electrical connector for making contact with a plurality of solder ball contact areas on an electronic device, comprising:
a substrate having a plurality of rigid conductive studs extending above a surface thereof;
a mask positioned above said substrate having a plurality of orifices and adapted to receive said solder balls when said electronic device is placed thereon, said mask aligning said solder balls over said conductive studs;
means for urging said electronic device, mask and substrate together when said electronic device is placed on said mask with its solder balls mating with said orifices, said means exerting sufficient force between said device and said conductive studs to cause some deformation of said solder balls by said studs.

10. The electrical connector as defined in claim 9 wherein said conductive studs are not wettable by solder.

* * * * *